United States Patent
Lebens et al.

(10) Patent No.: US 6,521,513 B1
(45) Date of Patent: Feb. 18, 2003

(54) SILICON WAFER CONFIGURATION AND METHOD FOR FORMING SAME

(75) Inventors: John A. Lebens, Rush, NY (US); Constantine N. Anagnostopoulos, Mendon, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/609,617

(22) Filed: Jul. 5, 2000

(51) Int. Cl.[7] ............................................. H01L 21/301
(52) U.S. Cl. ...................... 438/462; 438/460; 438/113; 438/928; 257/620
(58) Field of Search ................................ 438/462, 460, 438/463, 113, 928; 257/620; 83/27

(56) References Cited

U.S. PATENT DOCUMENTS

| | | | | |
|---|---|---|---|---|
| 4,925,808 A | * | 5/1990 | Richardson | 438/196 |
| 4,984,358 A | * | 1/1991 | Nelson | 438/109 |
| 5,501,893 A | | 3/1996 | Laermer et al. | |
| 5,656,547 A | * | 8/1997 | Richards et al. | 438/460 |
| 5,668,400 A | | 9/1997 | Quinn | |
| 5,753,959 A | | 5/1998 | Quinn et al. | |
| 5,814,885 A | | 9/1998 | Pogge et al. | |
| 5,904,546 A | | 5/1999 | Wood et al. | |
| 5,910,687 A | * | 6/1999 | Chen et al. | 257/784 |
| 5,928,526 A | * | 7/1999 | Morley | 216/65 |
| 6,306,731 B1 | * | 10/2001 | Igarashi et al. | 438/460 |
| 6,387,778 B1 | * | 5/2002 | Bonin et al. | 438/462 |

FOREIGN PATENT DOCUMENTS

| | | | | |
|---|---|---|---|---|
| JP | 04-116848 | * | 4/1992 | H01L/21/78 |
| JP | 05-36825 | * | 2/1993 | H01L/21/78 |

OTHER PUBLICATIONS

Wolf, S. and Tauber, R.N., "Silicon Processing for the VLSI Era", vol. 1, pp. 539, 541, 1986.*

* cited by examiner

Primary Examiner—Carl Whitehead, Jr.
Assistant Examiner—Christy Novacek
(74) Attorney, Agent, or Firm—Walter S. Stevens; Norman Rushefsky

(57) ABSTRACT

A method for singulating a semiconductor silicon wafer (10) comprising a plurality of semiconductor dice (20) arranged along a multiplicity of intersecting streets (30). Initially, a layer of photoresist (15) is patterned on the backside of the wafer (10). The semiconductor silicon wafer (10) is then etched using dry etching methods. As such, slots (22) are etched through the silicon of the wafer (10) aligned to the streets (30) forming a perforation. Simultaneously, tethers (40) are formed between the slots (22) interconnecting the adjacent dice (20) in order to maintain the wafer (10) mechanically intact. Furthermore, a membrane comprising integrated circuitry on the silicon wafer (10) is formed. The dice (20) of the wafer (10) are then separated for various purposes along the perforations. This is accomplished by applying pressure, such as manual pressure, to the wafer (10) so as to sever the tethers (40) which interconnect the dice (20) at their region (50) of reduced dimension.

34 Claims, 3 Drawing Sheets

SILICON WAFER CONFIGURATION AND METHOD FOR FORMING SAME

FIELD OF THE INVENTION

This invention relates in general to a silicon wafer configuration and to a method for forming same. More particularly, the invention relates to a method for singulating a semiconductor wafer comprising a plurality of semiconductor dice arranged along a multiplicity of intersecting streets.

BACKGROUND OF THE INVENTION

Without limiting the scope of the invention, its background is described in connection with semiconductor silicon wafers, as an example.

In semiconductor manufacture, integrated circuits are formed on a wafer formed of silicon or other semiconducting material. In general, layers of various materials, which are semiconducting, conducting or insulating, are utilized to form the integrated circuits. These materials are doped, deposited and etched using various well-known processes. The wafer is also processed resulting in a structure including a large number of individual semiconductor dice or chips.

MicroElectro Mechanical Systems (MEMS) can also be formed on a silicon wafer. Again, layers of various materials, which are semiconducting, conducting or insulating, are utilized to form the MEMS structures. The MEMS structures can also be combined with integrated circuits on the same wafer for control.

Following the device formation process, the wafer is diced to separate the individual dice for packaging or for use in an unpackaged form. The main techniques for wafer dicing are scribing and sawing. With scribing, a diamond tipped scribe is moved across the surface of the wafer along pre-formed scribe lines. These scribe lines are also referred to as "streets." The diamond scribe forms shallow scratches in the wafer surface. Upon the application of pressure, such as with a roller, the wafer separates along the scribe line. The breaks in the wafer follow the crystal lattice structure of the wafer substrate. Scribing can be used for wafers that are about 10 mils or less in thickness. For thicker wafers, sawing is the preferred method for dicing.

With sawing, a diamond-tipped saw rotating at high rotations per minute (rpms) contacts and saws the wafer along the streets. Sawing can be partially or completely through the wafer. Typically, with saw cutting, the wafer is mounted on a supporting member such as an elastomeric adhesive film stretched across a film frame. When sawing devices, dicing debris from the dicing process is generated on the wafer surface. A protective layer is usually applied to the wafer prior to dicing to protect it from such debris. This protective layer plus any dicing debris attached to it must be cleaned from the devices prior to bonding the device to the package.

One problem with either scribing or sawing is that chips and gouges can form along the severed edges of the die. In addition, cracks can form and propagate from the edges into the substrate of the die. Chipping and cracking are particularly a problem. With scribing, orientation of the chips on the wafer become important because the sides of a rectangular die can be scribed in the <1 1 0> directions only. Consequently, cleaving of a misoriented die results in a jagged separation line. Because of chipping and cracking, additional spacing is required between the dice on the wafer to prevent damage to the microcircuits. As a result, not as many dice can be formed on a standard sized wafer and wafer real estate is wasted.

Another problem in the prior art is that forming irregularly shaped dice or multiple sized dice on the same wafer is difficult or impossible. The formation of multiple sized die on a wafer is advantageous in maximizing the use of silicon "real estate" and reduce waste of material near the periphery of the almost-circular (but for the flat) wafer. However scribing or sawing is most reliably performed in straight lines across the whole wafer. Scribing or sawing in other than straight lines increases the likelihood of producing the previously mentioned chips, ragged edges, gouges and cracks in the silicon wafer. Streets not aligned in the <1 1 0> directions are difficult or impossible to scribe.

MEMS often have structures that are too fragile to survive exposure to some of the standard IC fabrication steps such as device separation and cleanup. An example is the inkjet printhead explained in commonly assigned U.S. patent application Ser. No. 09/017,827 filed on Feb. 3,1998. As described in the aforementioned patent application, the devices contain fluid channels etched through the wafer and oxide membranes with nozzles on the front of the wafer. Dicing such a wafer with conventional sawing methods would damage these thin oxide membranes. Conventionally in sawing, a high-pressure jet of water is used to clear the debris and act as lubricant as well as coolant for the wafer saw. Even though the high-pressure jet of water effectively removes both the debris and excess thermal energy, it represents a source of damage to any structures on the surface of the wafer.

A second example is MEMS that utilize a sacrificial layer, which after removal makes the device extremely fragile. An example is the mechanical grating device explained in commonly assigned U.S. patent application Ser. No. 09/216, 289 filed on Dec. 18,1998. As described in the aforementioned patent application, these MEMS have very small beams suspended over an air gap above electrodes formed on the surface of a silicon substrate. Once these structures are formed and the sacrificial material is etched from the air gap, the devices are very fragile. The devices cannot be exposed to liquids, such as would occur during water cleanup steps, without risking destruction of the beams. Therefore, etching of the sacrificial layer and any following steps such as testing are performed after sawing the wafer on individual chips instead of at the wafer level.

However wafer separation prior to device completion results in extensive device handling during the remaining device fabrication steps such as sacrificial material removal and device testing. Performing the remaining steps, especially device testing, on individual devices greatly increases the necessary handling and therefore the cost of the completed devices. Performing these processes in wafer form as opposed to device form greatly reduces the necessary handling because the processing equipment must only move and align to one wafer instead of many devices. Precise alignment is very critical for die testing.

Yet another problem in the prior art is that equipment associated with scribing and sawing is complex and hence costly to install and maintain. Moreover, diamond tipped scribes and saws are expensive and prone to wear out relatively quickly, thereby increasing operating costs.

Consequently, it is desirable to provide means for obviating the need to use diamond-tipped scribes and saws to separate dice formed on silicon semiconductor wafers.

SUMMARY OF THE INVENTION

The present invention provides a method and system for singulating a semiconductor wafer comprising a plurality of semiconductor dice arranged along a multiplicity of intersecting streets having different sizes and/or shapes therein.

The present invention also provides a method and system for singulating a semiconductor wafer that comprises a membrane with circuitry on it and a plurality of dice that can be easily fabricated and severed without destroying the membrane.

It is an object of the invention to provide a method for efficient processing debris intolerant devices allowing sacrificial layer removal and device testing in wafer form.

Accordingly, disclosed in one embodiment is a method for singulating a semiconductor wafer comprising a plurality of semiconductor dice arranged along a multiplicity of intersecting streets. The method comprises lithographically patterning the backside of the semiconductor wafer with a pattern aligned to the streets defined on the front side of the wafer The method also comprises the step of etching slots through the silicon of the wafer along the streets forming a perforation. The etching step is performed by dry etching methods, and further includes the step of forming a membrane comprising integrated circuitry on the semiconductor wafer. The etching step also includes the step of forming tethers between the slots interconnecting the adjacent dice to one another for maintaining the wafer mechanically intact.

The method further comprises the step of separating the dice of the silicon wafer along the perforation. The step of separating the dice further includes applying pressure, such as manual pressure, for severing the tethers, which interconnect the dice.

According to another embodiment, disclosed is a semiconductor silicon wafer comprising a plurality of semiconductor dice arranged along a multiplicity of intersecting streets having different sizes and/or shapes therein. Thus, different-sized dice will result in streets that are noncontiguous across the wafer. Irregularly shaped dice will result in irregularly shaped streets. That is, irregularly shaped dice include die with curved or rounded edges.

The semiconductor silicon wafer also comprises slots etched through the silicon of the wafer along the intersecting streets. The semiconductor silicon wafer also comprises tethers between the slots interconnecting adjacent dice for maintaining the wafer mechanically intact. The slots and tethers formed on the semiconductor silicon wafer together form a perforation for singulating the dice. The tethers further comprise a region of reduced dimension ranging from the length of said die to a single point. Thus, the region connects the dice to one another. As such, the tethers are made of silicon and are trapezoidal in shape. Furthermore, the trapezoidal shaped tethers are positioned in a complimentary inverse manner so as to form an interconnection between the dice using the points at the end of the region of reduced dimension of the tethers in order to facilitate severing the tethers. As such, the dice can be separated along the perforation using pressure, such as manual pressure, which can be applied to sever the tethers at the region of reduced dimension.

A technical advantage of the present invention includes maintaining the integrity of the wafer while etching through the wafer and creating the streets in the silicon wafer.

Another technical advantage includes the ability to singulate a semiconductor wafer arranged having different sizes and/or shapes of semiconductor dice included therein.

Other technical advantages include the provision of a method for singulating a semiconductor wafer using manual pressure or, in the alternative, a sharp object may be used to sever the dice at the point where the tethers interconnect the dice without destroying the membrane including circuitry.

BRIEF DESCRIPTION OF THE DRAWINGS

For a more complete understanding of the present invention, including its features and advantages, reference is made to the following detailed description of the invention, taken in conjunction with the accompanying drawings in which.

Corresponding numerals and symbols in the figures refer to corresponding parts in the detailed description unless otherwise indicated.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The specific embodiments discussed herein are merely illustrative of specific ways to make and use the invention, and do not or should not delimit the scope of the invention.

Figure 1:
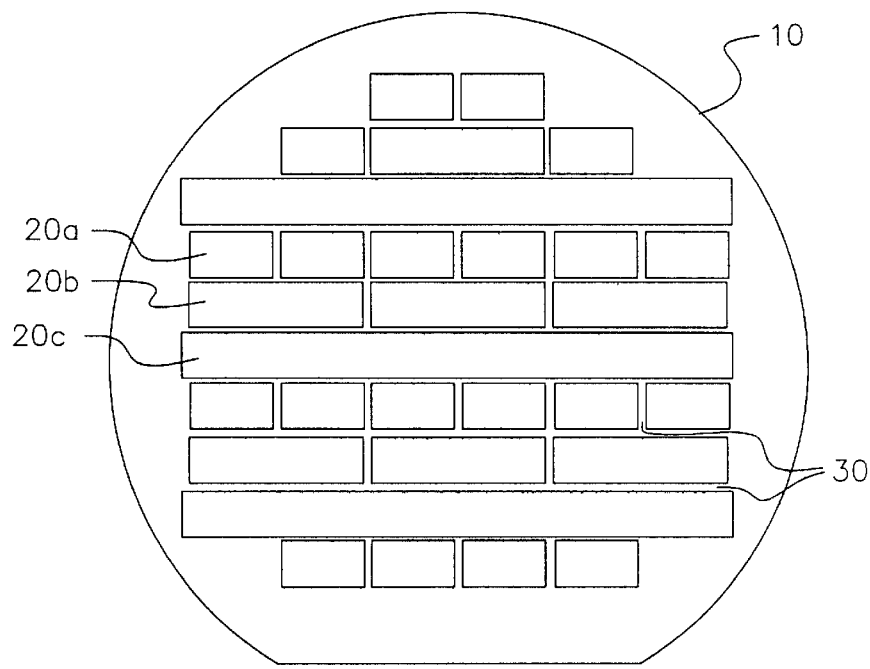
FIG. 1 is a diagram illustrating a semiconductor silicon wafer having regular shaped, but different size die, in accordance with a preferred embodiment of the present invention.

To better understand the invention, reference is made to FIG. 1 wherein a diagram illustrating a semiconductor silicon wafer, in accordance with a preferred embodiment of the present invention, is shown and denoted generally as 10. The silicon wafer 10 will generally have been processed to contain integrated circuits and/or micro-electromechanical devices fabricated by previous steps (not shown). Silicon wafer 10 includes a plurality of semiconductor dice 20, which are arranged along a multiplicity of intersecting streets 30. The semiconductor dice 20 can consist of multiple sizes and dimensions. For example, smaller semiconductor dice 20a can be intermixed with larger semiconductor dice 20b as well as much larger semiconductor dice 20c on the same silicon wafer 10 so that the resulting intersecting streets 30 do not form a continuous line across the silicon wafer 10. Dicing methods such as sawing or scribing would be difficult to use on such a silicon wafer 10 since such methods make continuous cuts along the whole wafer surface.

Figure 2:
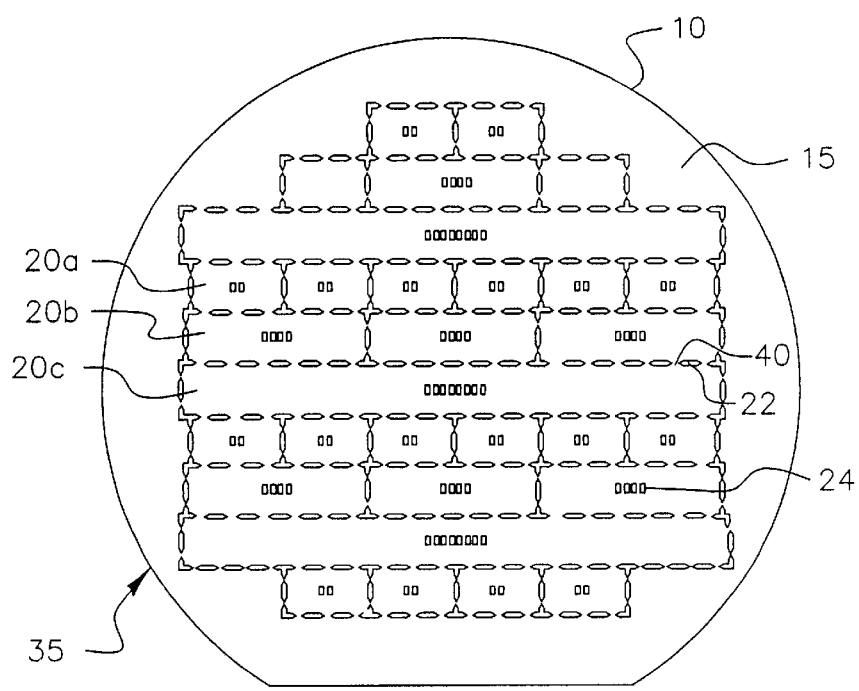
FIG. 2 depicts the patterning of the backside of the semiconductor silicon wafer, in accordance with a preferred embodiment of the present invention.

With reference now to FIG. 2, therein is shown the backside 35 of semiconductor silicon wafer 10 containing semiconductor dice 20 as illustrated in FIG. 1. Photoresist 15 is applied to the backside 35 of the silicon wafer 10. Next, the photoresist 15 is lithographically patterned to form features in the photoresist 15 on the backside 35 of the semiconductor wafer 10 as illustrated in FIG. 2. A back-to-front alignment system can be used to align the pattern formed on the backside 35 of the semiconductor wafer 10 with the semiconductor dice 20 defined on the front of the semiconductor wafer 10. The backside 35 of the silicon wafer 10 may be optionally thinned and polished prior to patterning. Thinning the silicon wafer 10 decreases the etch time needed to dice the wafer.

The pattern formed on the back side 35 of the semiconductor wafer 10 includes slots 22, which are then anisotropically etched through the silicon of the wafer 10 aligned to the streets 30 defined on the front of the semiconductor wafer 10. The etching of the silicon wafer is done in a system utilizing the anisotropic deep silicon etching process as described Laermer et.al., in U.S. Pat. No. 5501893. During the etching process, silicon tethers 40 are formed between slots 22 interconnecting adjacent dice 20 for maintaining the wafer 10 mechanically intact. As such, the slots 22 and tethers 40 together form a perforation for singulating the dice 20. The wafer 10 is diced to separate the individual dice 20 for packaging or for use in an unpackaged form.

In accordance with a preferred embodiment of the present invention, membrane slots 24 are also patterned inside the semiconductor dice region 20. These membrane slots 24 will be simultaneously anisotropically etched through the silicon of the wafer 10 leaving a membrane 26 on the front of the semiconductor dice 20. As an example, the etched membrane slots 24 are used as fluid ink feedthroughs to the nozzles on the front side of an inkjet printhead as explained in commonly assigned U.S. patent application Ser. No. 09/017,827 filed on Feb. 3,1998.

Figure 3:
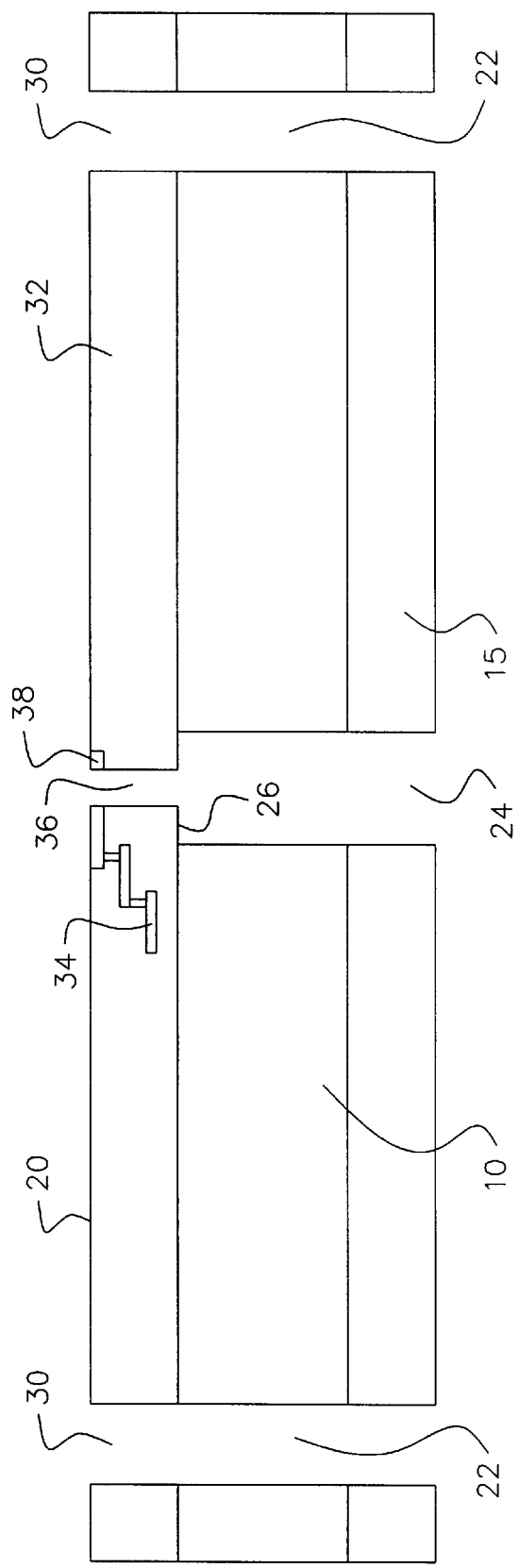
FIG. 3 shows the side view of the wafer comprising etched slots, in accordance with a preferred embodiment of the present invention.

FIG. 3 depicts a side view of the semiconductor silicon wafer 10 along a single die 20 after etching through the wafer. As an example, in the aforementioned inkjet printhead device, the front surface of the semiconductor die 20 will have been processed to contain integrated circuits fabricated by previous steps (not shown).The front of the silicon wafer 10 will also contain various oxide layers 32 in which is embedded the metal interconnect levels 34 illustrated in FIG. 3 of the CMOS circuitry. The CMOS circuitry is used to drive a resistive metal heater 38 that encircles the nozzle hole 36 etched into the oxide layer 32.

In order to pattern a silicon wafer 10 comprising a plurality of semiconductor dice 20 which are arranged among a multiplicity of intersecting streets 30, a layer of photoresist 15 is applied to the backside 15 of a semiconductor wafer 10 and patterned. The patterned layer of photoresist 15 acts as a mask for etching through the silicon wafer 10. The etching of the silicon wafer 10 can be done in a system utilizing the anisotropic deep silicon etching process developed by Laermer et. al., U.S. Pat. No. 5,501,893. The selectivity of the etch requires a photoresist layer >5 $\mu$m thickness. The etch process creates slots 22 at the edges of the semiconductor dice 20 which are aligned to the streets 30 on the front of the semiconductor wafer. The intersecting streets 30 may optionally have the oxide layer 32 removed as shown in FIG. 3.

At the same time slots 22 are etched, slot 24 is also etched. Slot 24 acts as a fluid interconnect between the back of the semiconductor wafer 10 and the nozzle 36 on the front of the wafer. The etching process is selective to oxide. Therefore the etched slot 24 will stop at the oxide layer 32 creating an oxide membrane 26 in which the nozzle 36 is located.

Figure 4:
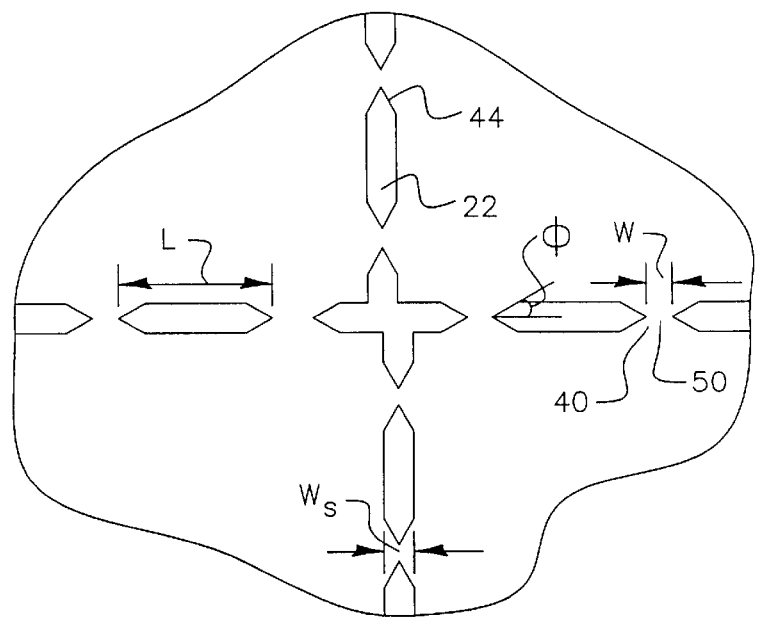
FIG. 4 depicts a close-up view of the backside pattern of the semiconductor wafer, in accordance with a preferred embodiment of the present invention.

With reference to FIG. 4, therein is shown a closer view of the etched slots 22 for a preferred embodiment of the present invention. Each end of the etched slots 22 is tapered 44 to a point. A taper angle $\phi<45$ degrees is preferred with a most preferred angle $\phi$ in the range 15–20 degrees. Too low a taper angle requires too fine a lithography resolution. Too high a taper angle will cause uncertainty in where the tethers will break. The tethers 40 formed therefore contain a region of reduced dimension 50 with width W. The region 50, thus, connects the dice 20 to one another. As such, once the semiconductor silicon wafer 10 is ready for separation of its dice 20, pressure is applied to the tethers 40 at their region of reduced dimension 50. This severs the tethers 40, which interconnect the dice 20. The width W of the region of reduced dimension 50 is important in maintaining the wafer mechanically intact. We have found that a width W<10 $\mu$m leaves the wafer fragile while a width >200 $\mu$m makes it hard to separate the die easily.

The period L of the slots 22 determine the number of tethers interconnecting adjacent dice 20 for maintaining the wafer 10 mechanically intact until it is desired to separate individual ones of dice 20 from wafer 10. Minimizing the period L increases the number of tethers attaching each die 20. We have found a period L of 100–200 $\mu$m to be adequate for most die sizes. The width of the slots Ws is selected as the desired width of the streets. It is important to note that when simultaneously etching slots 24 in the dice 20 it is useful to make all slot widths equal to minimize nonuniformity in e etch rate.

Prior to separating the dice 20, the photoresist 15 is removed from the back of the silicon wafer 10. The silicon wafer 10 is then cleaned and the semiconductor dice 20 tested at wafer level. The silicon wafer 10 is then bonded to a membrane, normally a piece of dicing tape, which is mounted in an aluminum ring as is well known in the art. In separating the dice 20, pressure is applied along the perforation formed by the tethers 40 and slots 22. Such pressure may include manual pressure or use of a sharp object to sever the tethers 40 at the region 50 of reduced dimension. As such, the selected dice 20 will then sever at region 50 from its adjacent neighbors due to breaking of its associated tethers 40. Therefore, use of diamond-tipped scribes and saws are not required to separate the individual ones of dice 20 from their neighbors. Furthermore, the possibility of the individual dice 20 resulting in ragged edges, chips and gouges along the severed edges is eliminated. Also, damage to integrated circuits are avoided due to the generation of chips, ragged edges and gouges along severed margins of the dice 20 being eliminated. The separated semiconductor dice can then be picked from the dicing tape for packaging.

Figure 5:
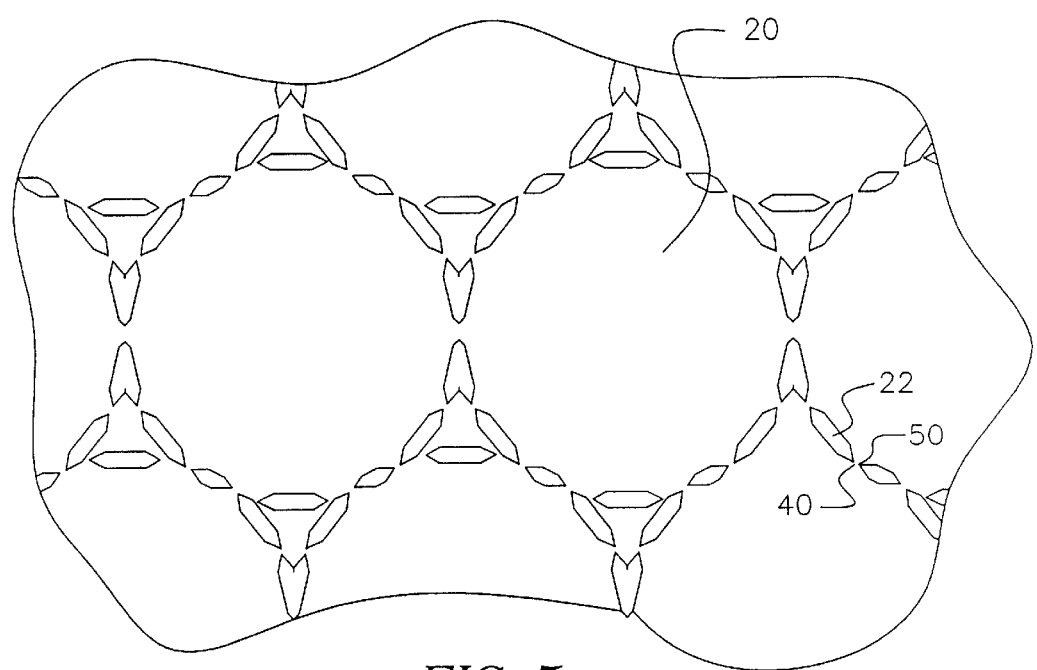
FIG. 5 depicts a semiconductor silicon wafer comprising irregular-shaped dice resulting in irregular-shaped streets, in accordance with a preferred embodiment of the present invention.

FIG. 5 shows an alternative configuration of silicon wafer 10, wherein some of dice 20 are of irregular shape, resulting in irregularly-shaped streets. In particular FIG. 5 illustrates semiconductor dice 20 that are circular, which may be required for various custom uses of the integrated circuits.

Of course, silicon wafer 10 is processed using known manufacturing techniques in order that each of the dice 20 includes integrated circuits (not shown), thereon. The integrated circuits comprise layers of various materials which are either semiconducting, conducting or insulating to form the integrated circuits. As such, slots 22 and tethers 40 are formed by anisotropically etching through the silicon wafer as previously described. As shown in FIG. 5 the size of the slots 22 can be varied to conform to the shape of the semiconductor dice 20.

The silicon wafer 10 is then bonded to a membrane, normally a piece of dicing tape, which is mounted in an aluminum ring as is well known in the art. In separating the dice 20, pressure is applied along the perforations formed by the tethers 40 and slots 22. Such pressure may include manual pressure or use of a sharp object to sever the tethers 40 at the region 50 of reduced dimension. As such, the selected dice 20 will then sever at region 50 from its adjacent neighbors due to breaking of its associated tethers 40.

It may be appreciated from this description of preferred embodiments of the invention that the use of diamond-tipped scribes and saws is not required in order to separate individual ones of dice 20 from their neighbors. Only manual pressure is required to obtain this result due to the presence of tethers 40. Also, it may be appreciated that the invention allows irregularly-shaped dice 20 to be conveniently produced to accommodate a wider range of uses for integrated circuits.

While this invention has been described with a reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

Parts List

10 ... semiconductor silicon wafer
15... photoresist
20 ... dice
20a .. small dice
20b .. medium dice
20c .. large dice
15 ... photoresist
22 ... slots
24 ... device slots
26 ... membrane
30 ... streets
32 ... oxide layer
34 ... metal interconnect levels
36 ... nozzle
38 ... heater
40 ... tethers
44 ... taper
50 ... region of reduced dimension

What is claimed is:

1. A method for singulating a semiconductor silicon wafer comprising a plurality of semiconductor dice arranged along a multiplicity of intersecting streets, the method comprising the steps of:
    patterning a layer of photoresist on the backside of said silicon wafer so that openings in the layer are aligned to said streets on the front of said silicon wafer,
    forming a series of slots by etching slots completely through the silicon of said silicon wafer that are aligned to said streets, wherein at least plural slots are provided at at least one side of each of the dice, the slots being formed with adjacent tethers of silicon to define perforations through the silicon;
    removing said layer of photoresist from said backside of said silicon wafer; and
    separating said dice of said silicon wafer along said perforations by application of pressure without scribing or sawing.

2. The method according to claim 1 wherein said etching step further includes the step of forming a membrane comprising integrated circuitry on said silicon wafer.

3. The method according to claim 1 wherein said etching step is performed by dry etching methods.

4. The method according to claim 1 wherein said dice are rectangular in shape and multiple sizes of dice are on said wafer.

5. The method according to claim 1 wherein said wafer further includes a membrane comprising integrated circuitry.

6. The method according to claim 1 wherein the space between slots is in the range 10–200 $\mu$m.

7. The method according to claim 1 wherein each of the dice includes a MEMS device.

8. The method according to claim 1 and wherein the dice are of different sizes and/or shapes.

9. The method according to claim 1 and wherein an oxide layer overlies the slots.

10. The method according to claim 1 wherein said etching step further includes the step of forming said tethers between said slots interconnecting adjacent dice for maintaining said wafer mechanically intact.

11. The method according to claim 10, wherein said step of separating said dice further includes applying pressure for severing said tethers which interconnect said dice.

12. The method according to claim 10 wherein said tethers are made of silicon.

13. The method according to claim 10, wherein said slots are formed with arrowhead shaped tapered structures at their respective ends and said tethers are formed of silicon between opposite facing arrowhead shaped structures of adjacent slots.

14. The method according to claim 13 wherein a reduced dimension of said tethers exist between respective opposing arrowhead shaped structures of adjacent slots which facilitates severing said tethers.

15. The method according to claim 1 wherein said dice are nonrectangular in shape.

16. The method according to claim 15 wherein said dice after being singulated include die with curved or rounded edges.

17. The method according to claim 15 wherein said dice after being singulated are circular in shape.

18. The method according to claim 1 wherein said slots are each tapered at each end at an angle<45 degrees.

19. The method according to claim 18 wherein said slots are each tapered at each end at an angle in the range of 15–20 degrees.

20. The method according to claim 1 wherein said slots are spaced at a period of 100–200 $\mu$m.

21. The method according to claim 20 wherein said dice are separated along said slots using pressure, said pressure applied to sever tethers between slots.

22. The method according to claim 1 and wherein membrane slots are formed inside the semiconductor die.

23. The method according to claim 22 and wherein the membrane slots comprise fluid ink feedthroughs to nozzles formed on the front side of the die.

24. A method for singulating a semiconductor wafer comprising a plurality of semiconductor dice arranged along a multiplicity of intersecting streets, the method comprising the steps of:
    patterning a layer of photoresist on a backside of said wafer with openings aligned to said streets on the front of the wafer;
    etching slots completely through a substrate of said wafer aligned to said streets and forming perforations with tethers between said slots interconnecting adjacent dice for maintaining said wafer mechanically intact, at least some dice having plural slots arranged along at least one side of a respective die;
    removing the photoresist layer; and severing said dice of said wafer at the points where said perforations exist and where said tethers interconnect said dice by application of pressure without scribing or sawing.

25. A method for singulating a semiconductor wafer comprising a plurality of silicon semiconductor dice arranged along a multiplicity of intersecting streets, the method comprising the steps of:

patterning a layer of photoresist on a backside of said wafer to provide openings aligned to said streets on the front of the wafer;

etching slots completely through the silicon of said wafer aligned to said streets to form perforations with tethers between said slots interconnecting adjacent dice for maintaining said wafer mechanically intact;

removing the photoresist layer;

severing said dice of said wafer at the points where said perforations exist and where said tethers interconnect said dice by application of pressure and without scribing and sawing; and wherein said etching step further comprises the step of forming tethers which comprise a region of reduced dimension ranging from the length of said die to a single point, said region connecting said dice to one another.

26. The wafer according to claim 25 wherein the region of reduced dimension is in the range 10–200 $\mu$m wide.

27. A method for singulating a semiconductor wafer comprising a plurality of silicon semiconductor dice arranged along a multiplicity of intersecting streets, the method comprising the steps of:

patterning a layer of photoresist on a backside of said wafer to provide openings aligned to said streets on the front of the wafer, etching slots through the silicon of said wafer aligned to said streets forming tethers between said slots interconnecting adjacent dice for maintaining said wafer mechanically intact, said slots being formed with tapered arrowhead shaped structures at their respective ends and said tethers being formed between opposite facing arrowhead shaped structures of adjacent slots;

removing the photoresist layer, and severing said dice of said wafer at the point where said tethers interconnect said dice.

28. The method according to claim 27 wherein a reduced dimension of said tethers exist between respective opposing arrow head shaped structures of adjacent slots which facilitates severing said tethers.

29. The method according to claim 27 wherein said step of severing said dice further includes applying pressure for separating said dice where said tethers interconnect said dice.

30. The method according to claim 29 and wherein no scribing and sawing is used in the method of singulating.

31. A method for singulating a semiconductor silicon wafer comprising a plurality of semiconductor dice arranged along a multiplicity of intersecting streets, the method comprising the steps of:

patterning a layer of photoresist on the backside of said silicon wafer so that openings in the layer are aligned to said streets on the front of said silicon wafer;

forming a series of slots by etching slots through the silicon of said silicon wafer that are aligned to said streets, wherein at least plural slots are provided at at least one side of each of the dice, the slots being provided with tapered arrowhead shaped structures at their respective ends and wherein said etching step further includes the step of forming tethers between opposing arrowhead shaped structures of adjacent ones of said slots the tethers interconnecting adjacent dice for maintaining said wafer mechanically intact;

removing said layer of photoresist from said backside of said silicon wafer; and separating said dice of said silicon wafer along said slots.

32. The method according to claim 31 wherein a reduced dimension of said tethers exist between respective opposing arrowhead structures of adjacent slots which facilitates severing said tethers.

33. A method for singulating a semiconductor silicon wafer comprising a plurality of semiconductor dice arranged along a multiplicity of intersecting streets, the method comprising the steps of;

patterning a layer of photoresist on the backside of said silicon wafer so that openings in the layer are aligned to said streets on the front of said silicon wafer, forming a series of slots by etching slots through the silicon of said silicon wafer that are aligned to said streets, wherein at least plural slots are provided at at least one side of each of the dice and wherein said slots are each tapered at each end at an angle<45 degrees;

removing said layer of photoresist from said backside of said silicon wafer; and separating said dice of said silicon wafer along said slots.

34. The method according to claim 33 wherein said slots are each tapered at each end at an angle in the range of 15–20 degrees.

* * * * *